United States Patent
Jang

(10) Patent No.: US 12,069,910 B2
(45) Date of Patent: *Aug. 20, 2024

(54) DISPLAY DEVICE AND MANUFACTURING METHOD OF DISPLAY DEVICE

(71) Applicant: Samsung Display Co., Ltd., Yongin-si (KR)

(72) Inventor: Joo-nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 318 days.

This patent is subject to a terminal disclaimer.

(21) Appl. No.: 17/354,990

(22) Filed: Jun. 22, 2021

(65) Prior Publication Data

US 2021/0320168 A1    Oct. 14, 2021

Related U.S. Application Data

(63) Continuation of application No. 16/527,868, filed on Jul. 31, 2019, now Pat. No. 11,049,924.

(30) Foreign Application Priority Data

Sep. 18, 2018  (KR) ......................... 10-2018-0111525

(51) Int. Cl.
| | |
|---|---|
| *H01R 4/04* | (2006.01) |
| *H01R 12/62* | (2011.01) |
| *H05K 1/09* | (2006.01) |
| *H05K 1/11* | (2006.01) |
| *H05K 1/18* | (2006.01) |

(Continued)

(52) U.S. Cl.
CPC ............. *H10K 59/131* (2023.02); *H01R 4/04* (2013.01); *H01R 12/62* (2013.01); *H05K 1/09* (2013.01); *H05K 1/118* (2013.01); *H05K 1/189* (2013.01); *H05K 3/328* (2013.01); *H05K 2201/10128* (2013.01); *H05K 2203/0292* (2013.01); *H05K 2203/1377* (2013.01)

(58) Field of Classification Search
CPC ............ H01R 4/04; H05K 1/09; H05K 1/118; H05K 1/189; H05K 3/328; H10K 59/131
See application file for complete search history.

(56) References Cited

U.S. PATENT DOCUMENTS

| | | | |
|---|---|---|---|
| 9,324,670 B2 | 4/2016 | Hwang et al. | |
| 9,899,344 B2 * | 2/2018 | Lin | ................... H01L 23/49816 |
| 10,515,881 B2 | 12/2019 | Kim et al. | |

(Continued)

FOREIGN PATENT DOCUMENTS

| | | |
|---|---|---|
| CN | 108206173 A | 6/2018 |
| EP | 0 902 500 A2 | 3/1999 |

(Continued)

*Primary Examiner* — Sardis F Azongha
(74) *Attorney, Agent, or Firm* — Lewis Roca Rothgerber Christie LLP

(57) ABSTRACT

A display device includes a display module and a circuit board. The display module includes a base substrate, which includes a display area and a non-display area adjacent to the display area, and a first pad positioned on the base substrate and overlapping the non-display area. The circuit board includes a first board and a second pad positioned on the first board and contacting the first pad, wherein the second pad is provided with a first metal layer of a single material.

11 Claims, 15 Drawing Sheets

(51) Int. Cl.
    *H05K 3/32*      (2006.01)
    *H10K 59/131*    (2023.01)

(56) References Cited

U.S. PATENT DOCUMENTS

| | | |
|---|---|---|
| 10,658,451 B2 * | 5/2020 | Koh .................... H10K 59/131 |
| 2015/0060783 A1 | 3/2015 | Yoon |
| 2015/0060792 A1 | 3/2015 | Lee et al. |
| 2017/0123543 A1 | 5/2017 | Choi et al. |
| 2017/0352716 A1 * | 12/2017 | Lee ........................ H10K 77/10 |
| 2018/0122889 A1 | 5/2018 | Kim et al. |
| 2018/0188579 A1 | 7/2018 | Jeong et al. |

FOREIGN PATENT DOCUMENTS

| | | |
|---|---|---|
| JP | 2017-165629 A | 9/2017 |
| KR | 10-0528437 B1 | 11/2005 |
| KR | 10-0896127 B1 | 5/2009 |
| KR | 2017-0130675 A | 11/2017 |
| KR | 2018-0070774 A | 6/2018 |

\* cited by examiner

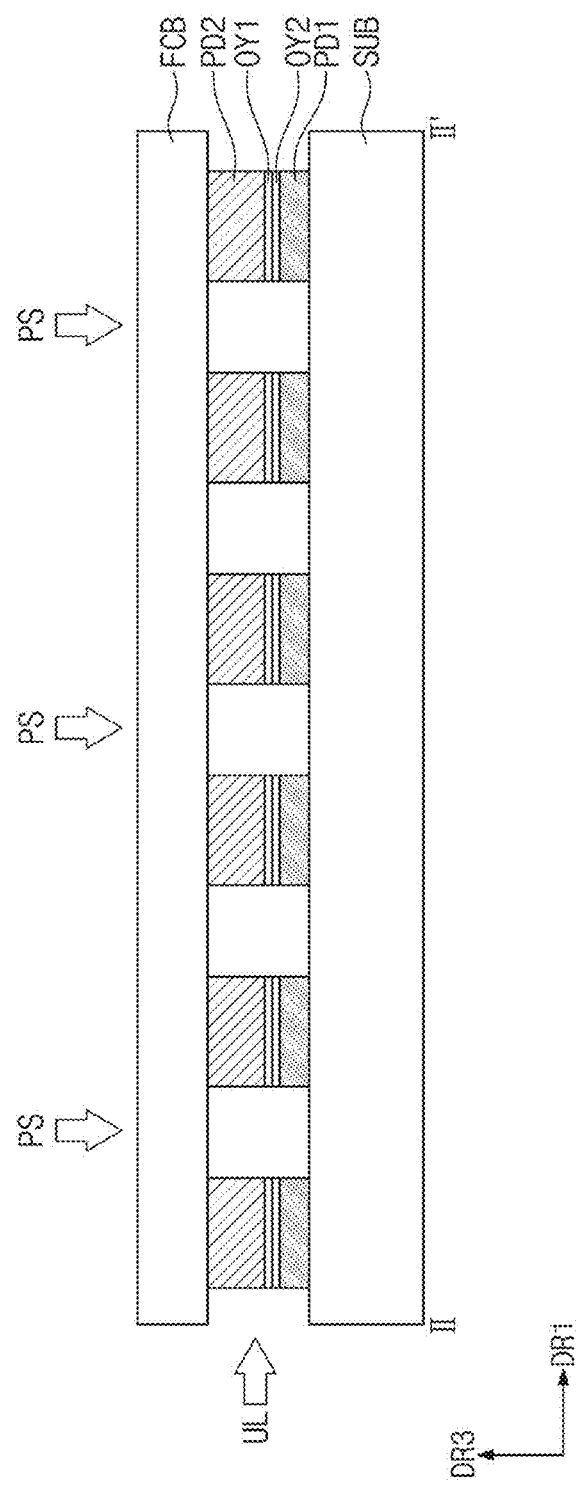

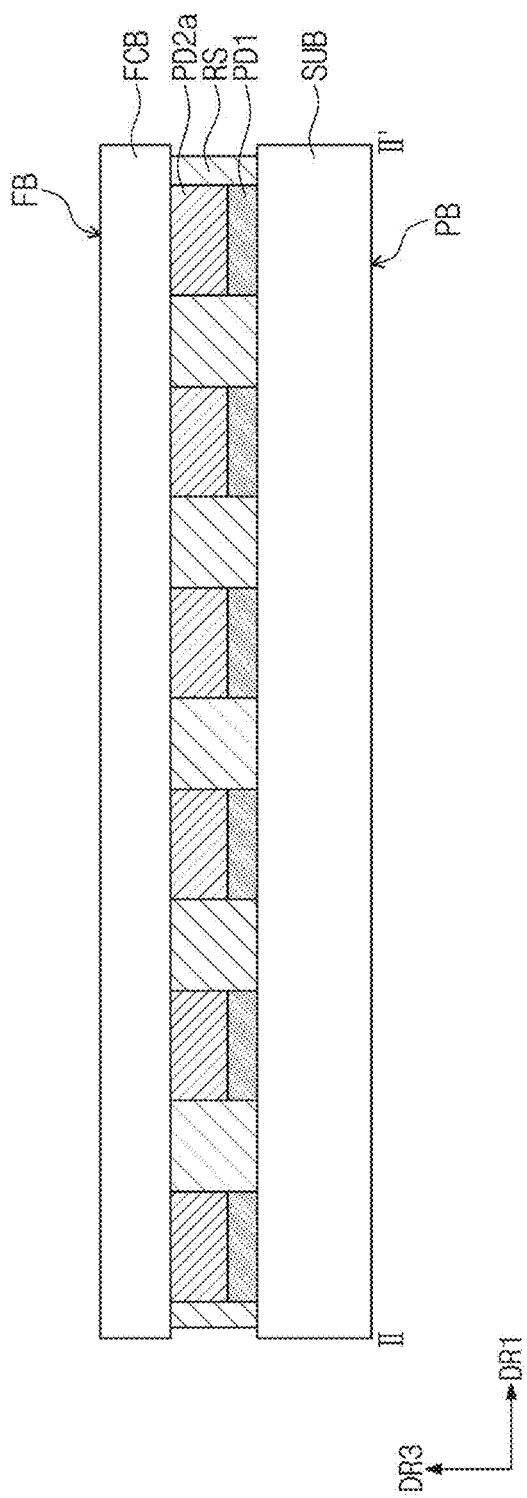

DISPLAY DEVICE AND MANUFACTURING METHOD OF DISPLAY DEVICE

CROSS-REFERENCE TO RELATED APPLICATIONS

This application is a continuation of U.S. patent application Ser. No. 16/527,868, filed Jul. 31, 2019, which claims priority to and the benefit of Korean Patent Application No. 10-2018-0111525, filed Sep. 18, 2018, the entire content of both of which is incorporated herein by reference.

BACKGROUND

One or more aspects of embodiments of the present disclosure herein are directed toward a display device and more particularly, toward a display device and a manufacturing method thereof.

Various display devices, which may be used in a multimedia device such as a television, a mobile phone, a tablet computer, a navigator, and/or a game player, are being developed.

A display device includes a display panel for displaying an image. The display panel includes a plurality of gate lines, a plurality of data lines, and a plurality of pixels connected to the plurality of gate lines and the plurality of data lines. The display panel may be connected (or coupled) to a circuit board for providing an electrical signal (necessary for an image display) to the gate lines and/or the data lines.

The circuit board may be connected to the display panel using an anisotropic conductive film or an ultrasonography scheme. Among these, a connection scheme between the display panel and the circuit board using the ultrasonography scheme may further enhance connectivity and reduce (e.g., simplify) a manufacturing process in comparison to the anisotropic conductive film scheme.

SUMMARY

One or more aspects of embodiments of the present disclosure are directed toward a display device in which a circuit board and a display panel are bonded using an ultrasonic bonding scheme, and a manufacturing method thereof.

An embodiment of the inventive concept provides a display device including: a display module including a base substrate, the base substrate having a display area and a non-display area adjacent to the display area, and a first pad on the base substrate and overlapping the non-display area; and a circuit board including a first board and a second pad on the first board and contacting the first pad, wherein the second pad is provided with a first metal layer composed of a single material.

In an embodiment, the first pad may include: a first sub metal layer on the base substrate; a second sub metal layer on the first sub metal layer; and a third sub metal layer on the second sub metal layer and contacting the second pad.

In an embodiment, at least a portion of the second sub metal layer may contact the second pad.

In an embodiment, a thickness of the second sub metal layer may be larger than that of each of the first sub metal layer and the third sub metal layer.

In an embodiment, the first sub metal layer and the third sub metal layer may be composed of the same material.

In an embodiment, the first sub metal layer and the third sub metal layer may be composed of titanium, and the second sub metal layer may be composed of aluminum.

In an embodiment, the first metal layer may be composed of copper.

In an embodiment, the display device may further include a resin between the base substrate and the first board, the resin surrounding the first pad and the second pad.

In an embodiment, the circuit board may further include: a third pad separated from the second pad on a plane of the circuit board and electrically connected to the second pad; and a driving circuit board including a second board and a driving pad on the second board and electrically connected to the third pad.

In an embodiment, the display device may further include an anisotropic conductive film electrically connecting the third pad and the driving pad, wherein the anisotropic conductive film includes: an adhesive film between the first board and the second board; and conductive particles in the adhesive film and configured to electrically connect the third pad and the driving pad.

In an embodiment, the third pad may include: a second metal layer on the first board; and an auxiliary metal layer on the second metal layer and configured to electrically contact the conductive particles, wherein the second metal layer may be composed of the same material as that of the first metal layer.

In an embodiment, the auxiliary metal layer may be composed of antimony.

In an embodiment, the third pad may be provided with a second metal layer composed of a single material, and the third pad may contact the driving pad.

In an embodiment, the circuit board may be a flexible board.

In an embodiment, each of the first pad and the second pad may be provided in plurality.

In an embodiments of the inventive concept, a manufacturing method of a display device includes: arranging a first pad on a display substrate and a second pad on a circuit board; contacting the first pad with the second pad; applying a pressure on the circuit board in a thickness direction of the display substrate; and generating an ultrasonic vibration to an interface between the first pad and the second pad, while the pressure is applied, wherein the second pad is provided with a metal layer composed of a single material.

In an embodiment, the manufacturing method may further include positioning a resin between the display substrate and the circuit board to surround the first pad and the second pad.

In an embodiment, the first pad may include: a first sub metal layer on the display substrate and composed of a first metal material; a second sub metal layer on the first sub metal layer and composed of a second metal material; and a third sub metal layer on the second sub metal layer, the third sub metal layer contacting the second pad and composed of the first metal material.

In an embodiment, at least a portion of the second pad may directly contact the second sub metal layer.

In an embodiment, the second pad may be composed of copper.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept.

In the drawings:

FIGS. 11A-11C are drawings showing an ultrasonic bonding between the first pad and the second pad.

DETAILED DESCRIPTION

Figure 1:
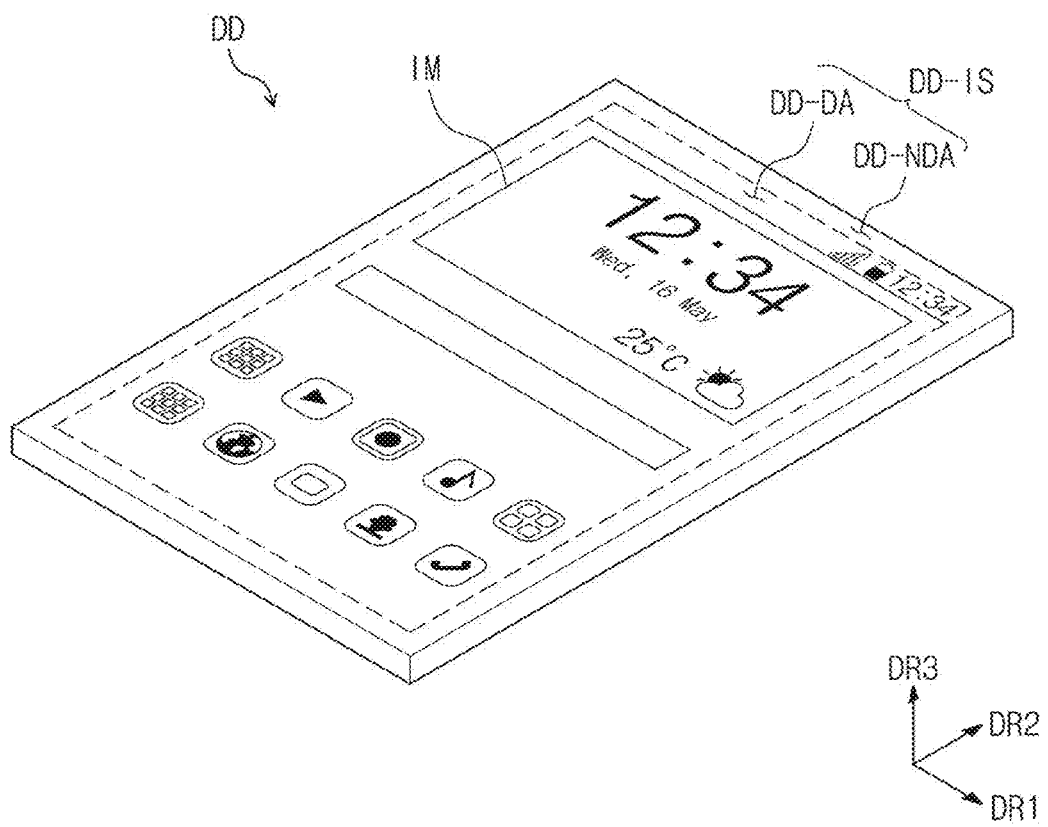
FIG. 1 is a perspective view of an embodiment of the inventive concept.

It will be understood that when an element or layer is referred to as being "on", "connected to" or "coupled to" another element or layer, it can be directly on, connected or coupled to the other element, or intervening elements may be present.

Like reference numerals in the drawings refer to like elements throughout. In addition, in the drawings, the thickness, the ratio, and the dimension of the elements may be exaggerated for effective description of the technical contents, and embodiments of the present disclosure are not limited to the provided representations.

The term "and/or" includes any and all combinations of one or more of the associated items.

Expressions such as "at least one of," "one of," and "selected from," when preceding a list of elements, modify the entire list of elements and do not modify the individual elements of the list.

Further, the use of "may" when describing embodiments of the present invention refers to "one or more embodiments of the present invention.

Terms such as "first," "second," and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present invention. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes", "comprises," "comprising," and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, embodiments will be described in more detail with reference to the accompanying drawings.

Figure 2:
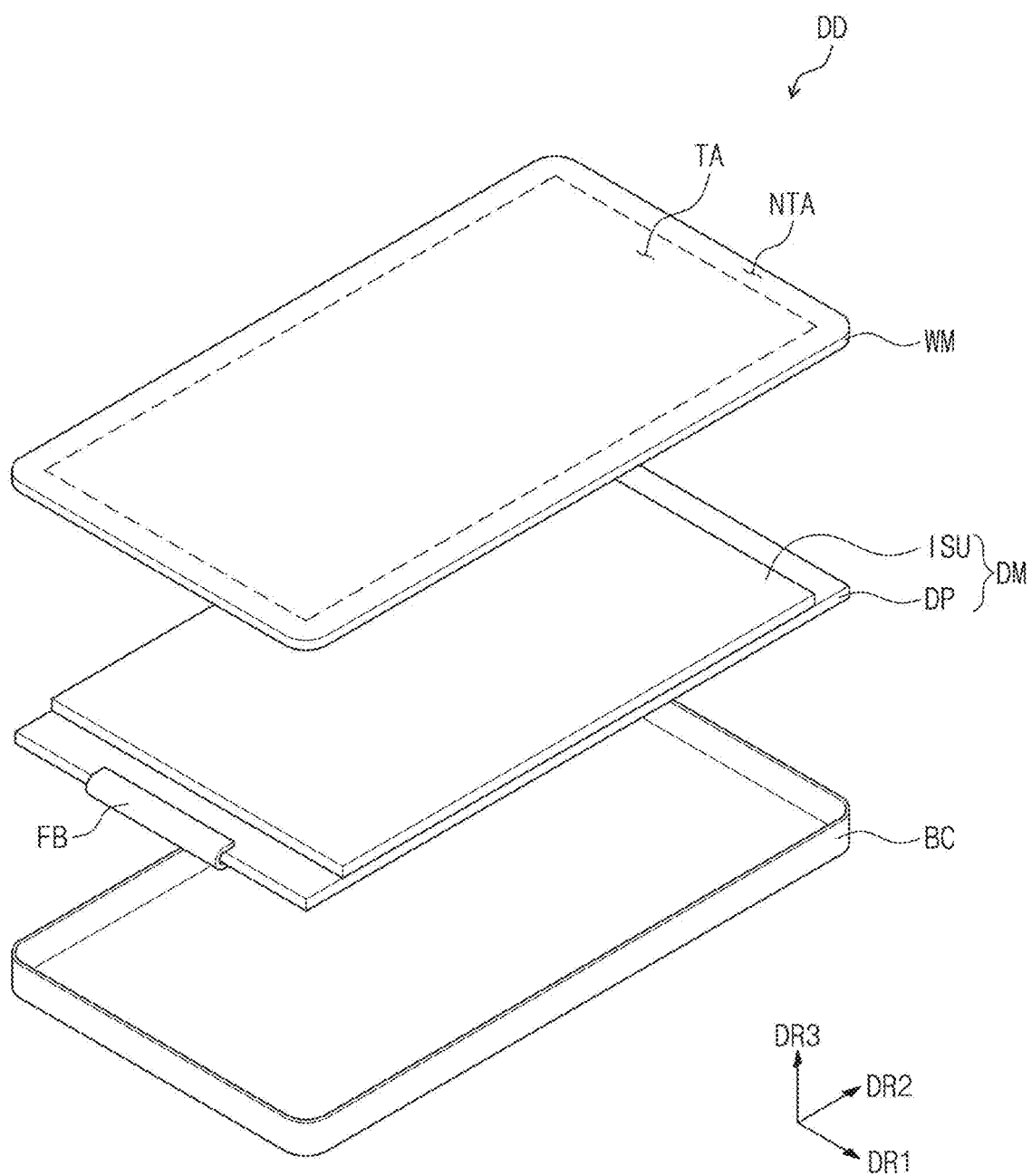
FIG. 2 is an exploded perspective view of a display device according to an embodiment of the inventive concept.

FIG. 1 is a perspective view of an embodiment of the inventive concept. FIG. 2 is an exploded perspective of a display device according to an embodiment of the inventive concept.

In relation to FIG. 1, the display device DD may display an image IM on a display surface DD-IS. According to the inventive concept, the display device DD provided with a planar display surface DD-IS is shown, but embodiments of the inventive concept are not limited thereto. The display device DD may include a curved display surface or a stereoscopic display surface, without limitation. The stereoscopic display surface includes a plurality of display areas configured to indicate different directions, for example, a polygonal columnar display surface.

According to an embodiment of the inventive concept, the display device DD may be a flexible display device. However, an embodiment of the inventive concept is not limited thereto, and the display device according to inventive concept may be a rigid display device.

According to the present embodiments, electronic modules, a camera module, a power supply module, and/or the like may be disposed (positioned) in a bracket/case and/or the like together with the display device DD, to form a mobile terminal. The display device DD in an embodiment of the inventive concept may be applied to a large electronic device such as a television and/or a monitor, and/or a small or medium electronic device such as a tablet, a vehicle navigator, a game player and/or a smart watch.

The display surface DD-IS may be parallel to a surface defined by a first direction DR1 and a second direction DR2. A direction normal to the display area DD-IS, namely, a thickness direction of the display device DD, is indicated by a third direction DR3. The front surface (or top surface) and the rear surface (or bottom surface) of each member, element, or unit to be described below are distinguished by the third direction DR3 (e.g., the rear (or bottom) surface and the front (or top surface) are arranged sequentially in the third direction DR3). However, the first to third directions DR1, DR2, and DR3 shown in the embodiment are just example, and the directions indicated by the first to third directions DR1, DR2, and DR3 may be converted to the reverse directions.

As illustrated in FIG. 1, the display surface DD-IS includes a display area DD-DA on which the image IM is displayed and a non-display area DD-NDA adjacent to the display area DD-DA. The non-display area DD-NDA is an area on which the image is not displayed. In FIG. 1, application icons and a watch widget are illustrated as an example of the image IM.

In some embodiments, the display area DD-DA has a rectangular shape and is surrounded by the non-display area DD-NDA. However, an embodiment of the inventive concept is not limited thereto, and the shape of the display area DD-DA and the shape of the non-display area DD-NDA may be variously designed. For example the non-display area DD-NDA may be disposed (e.g., positioned) adjacent only to any one side of the display area DD-DA, or may be omitted.

In relation to FIG. 2, the display area DD may include a window member WM, a display module DM, a circuit board FB, and a container member BC.

The window member WM is disposed on a top portion of the display module DM and may transmit an image provided from the display module DM through a transmissive area TA. The window member WM includes the transmissive area TA and a non-transmissive area NTA. The transmissive area TA may have a shape corresponding to the display area DD-DA shown in FIG. 1. In some embodiments, the image IM displayed in the display area DD-DA of the display device DD may be externally viewed through the transmissive area TA of the window member WM.

The non-transmissive area NTA may have a shape corresponding to the non-display area DD-NDA shown in FIG. 1. The non-transmissive area NTA may have a relatively low optical transmittance in comparison to the transmissive area TA. However, the technical spirit of the inventive concept is not limited thereto, and in some embodiments, the non-transmissive area NTA may not be included.

The window member WM may be formed from glass, sapphire, plastic, and/or the like. Although shown to have a single layer, the window member WM may include a plurality of layers. The window member WM may include a base layer overlapping the non-transmissive area NTA, and may include at least one printing layer disposed on the rear surface of the base layer. The printing layer may have a prescribed color. For example, the printing layer may be provided in a black color, and/or color(s) other than the black color.

The display module DM may be disposed between the window member WM and the container member BC. The display module DM includes a display panel and an input sensing unit ISU.

The display panel DP may generate an image and deliver the generated image to the window member WM. According to an embodiment of the inventive concept, the display panel DP may be an organic light emitting display panel, a liquid crystal display panel, or a quantum dot light emitting display panel, and is not particularly limited. For example, the organic light emitting display panel includes organic light emitting elements. The liquid crystal panel includes liquid crystal molecules. The quantum dot light emitting display panel includes quantum dots, or quantum rods.

Hereinafter, the display panel DP according to an embodiment of the inventive concept will be described as the organic light emitting display panel. However, the technical spirit of the inventive concept is not limited thereto, and various suitable display panels may be applied to the present inventive concept.

The input sensing unit ISU may be disposed between the window member WM and the display panel DP. The input sensing unit ISU senses an input applied externally. The input applied externally may be provided in various suitable ways. The external input may include various suitable types (or kinds) of external inputs from, for example, a part of the user's body, a stylus pen, light, heat, and/or pressure. In addition, the external input may not only be an input generated from a contact of a part of the body such as a user's finger, but also an input from a touch of a proximal or adjacent space.

The input sensing unit ISU may be directly disposed on the display panel DP. For example, the input sensing unit ISU in the embodiment may be manufactured through continuous processes with the display panel DP. However, the technical spirit of the inventive concept is not limited thereto, and the input sensing unit ISU may be provided as an individual panel so as to be combined with the display panel DP. As another example, the input sensing unit ISU may be omitted.

The circuit board FB may be connected (or coupled) to one end of the display panel DP to provide a driving signal to the display panel DP. The driving signal may be a signal for displaying an image on the display panel DP. Although in FIG. 2, only the structure in which the circuit board FB is connected to the display panel is illustrated, embodiments of the inventive concept are not limited thereto. For example, the display device DD may further include a touch circuit board connected to the input sensing unit ISU. The touch circuit board may provide a touch driving signal to the input sensing unit ISU. In the embodiments of the present disclosure, a bonding scheme in which the circuit board FB is connected to the display panel DP may be substantially the same as that in which the touch circuit board is connected to the input sensing unit ISU.

The container member BC may be combined with the window member WM. The container member BC provides the rear surface of the display device DD and is combined with the window member WM to define an internal space. The container member BC may include a material having a relatively high harness property. For example, the container member BC may include a plurality of frames and/or a plurality of plates composed of glass, plastic, and/or metal. The container member BC may stably (or suitably) protect components of the display device DD contained in the internal space from an external shock.

Although the container member BC is described hereinabove to include the material having high hardness property, embodiments of the inventive concept are not limited thereto. For example, the container member BC may include a flexible material, and the display device DD according to an embodiment of the inventive concept may have flexible (e.g., folding and/or bending) properties. As a result, the components included in the display device DD may also have flexible properties.

Figure 3:
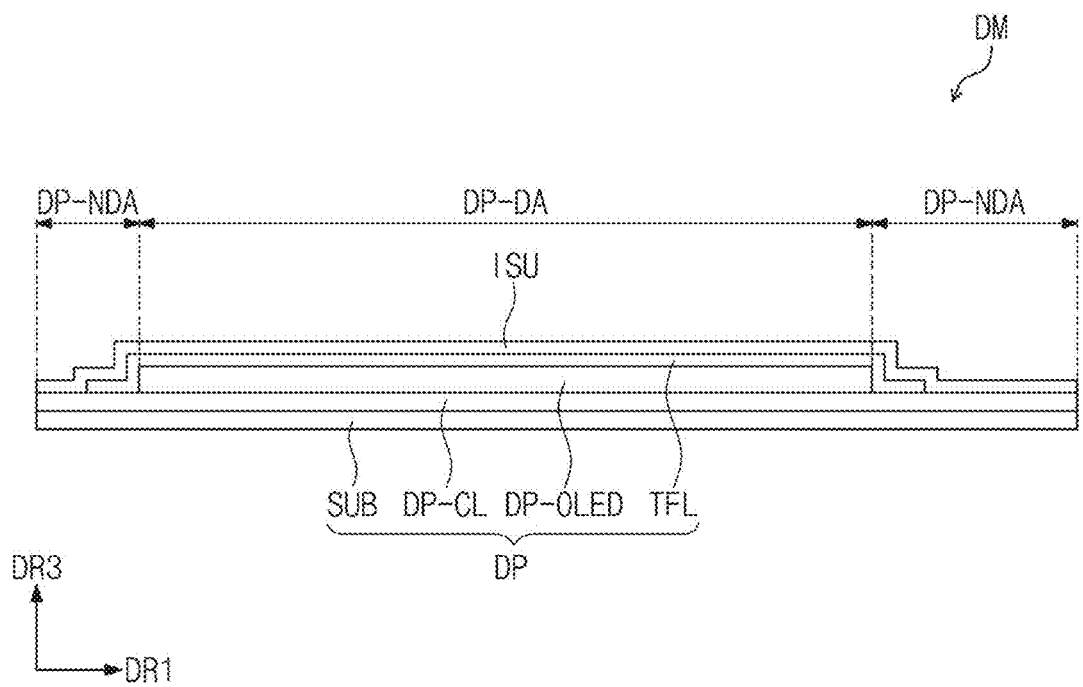
FIG. 3 is a sectional view of a display module according to an embodiment of the inventive concept.

FIG. 3 is a sectional view of a display module according to an embodiment of the inventive concept.

In relation to FIG. 3, the display panel DP includes a base substrate SUB, a circuit element layer DP-CL disposed on the base substrate SUB, a display element layer DP-OLED and an insulation layer TFL. The input sensing unit ISU may be directly disposed on the insulation layer TFL. In the present specification, when a component A is described as being "directly disposed" on a component B, this means that an adhesive layer is not disposed between component A and component B.

The base substrate SUB may include at least one plastic film. For example, the base substrate SUB may include a plastic substrate as a flexible substrate, a glass substrate, a metal substrate, an organic/inorganic composite material substrate, and/or the like. The display area DD-DA and the non-display area DD-NDA described in relation to FIG. 1 may respectively correspond to a display area DD-DA and a non-display area DD-NDA defined on the base substrate SUB shown in FIG. 3. Hereinafter, the base substrate SUB may be described as a display substrate.

In some embodiments, the circuit element layer DP-CL includes at least one intermediate insulation layer and a circuit element. The intermediate insulation layer may include at least one intermediate inorganic film and at least one intermediate organic film. The circuit element may include signal lines and a driving circuit of a pixel, and/or the like.

In some embodiments, the display element layer DP-OLED includes a plurality of organic light emitting diodes. The display element layer DP-OLED may further include an organic film such as a pixel define layer. According to another embodiment, when the display panel is provided with a liquid crystal display panel, the display element layer may be provided with a liquid crystal layer.

The insulation layer TFL encapsulates the display element layer DP-OLED. For example, the insulation layer TFL may include a thin-film encapsulation layer. The insulation layer TFL may protect the display element layer DP-OLED from foreign materials such as moisture, oxygen and/or dust particles. Although in FIG. 3, the insulation layer TFL is shown to overlap the display area DP-DA and the non-display area DP-NDA, embodiments of the inventive concept are not limited thereto. For example, the insulation layer TFL may not overlap the non-display area DP-NDA.

Figure 4:
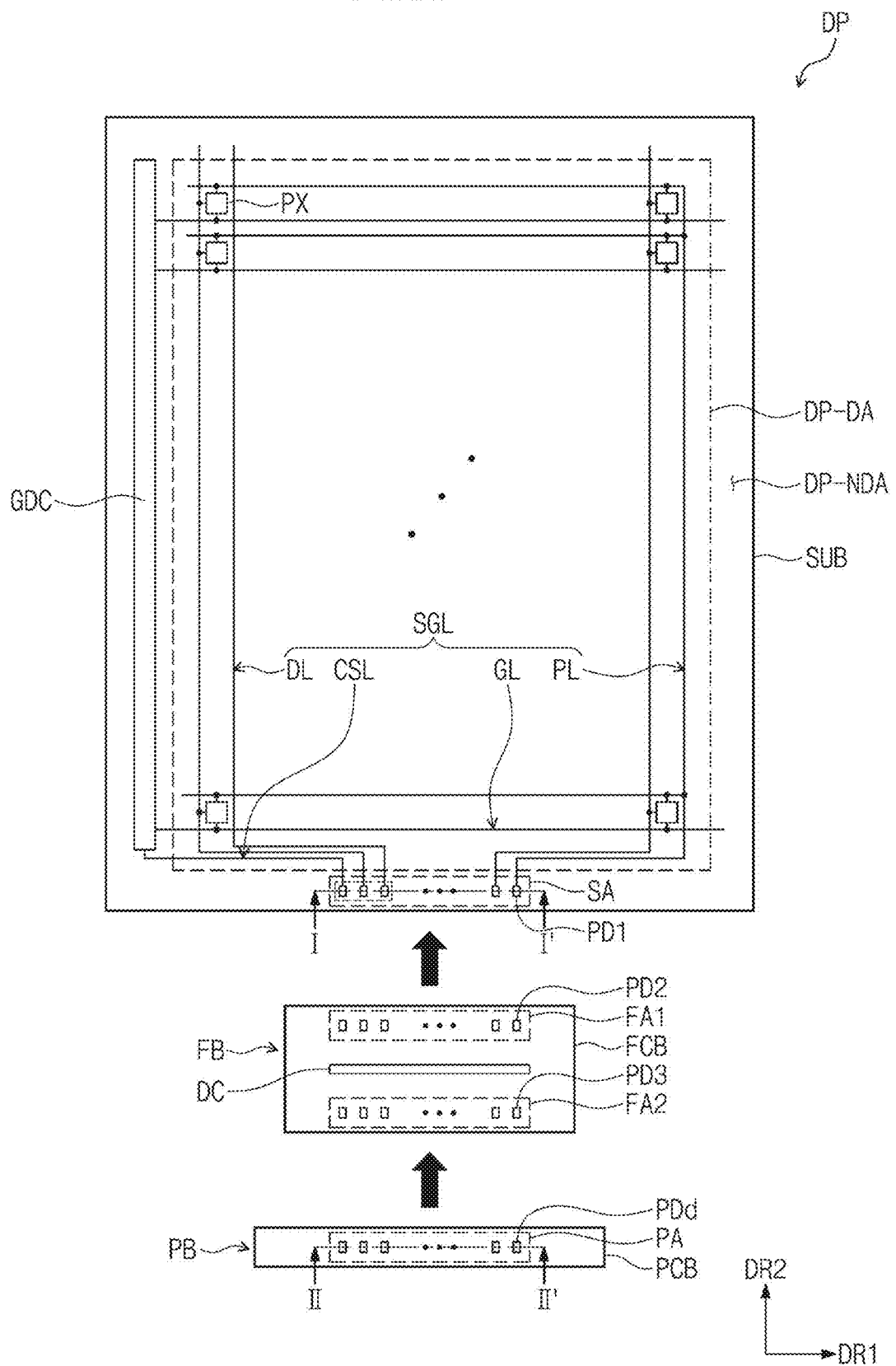
FIG. 4 is a plan view of the display device according to an embodiment of the inventive concept.
Figure 5A:
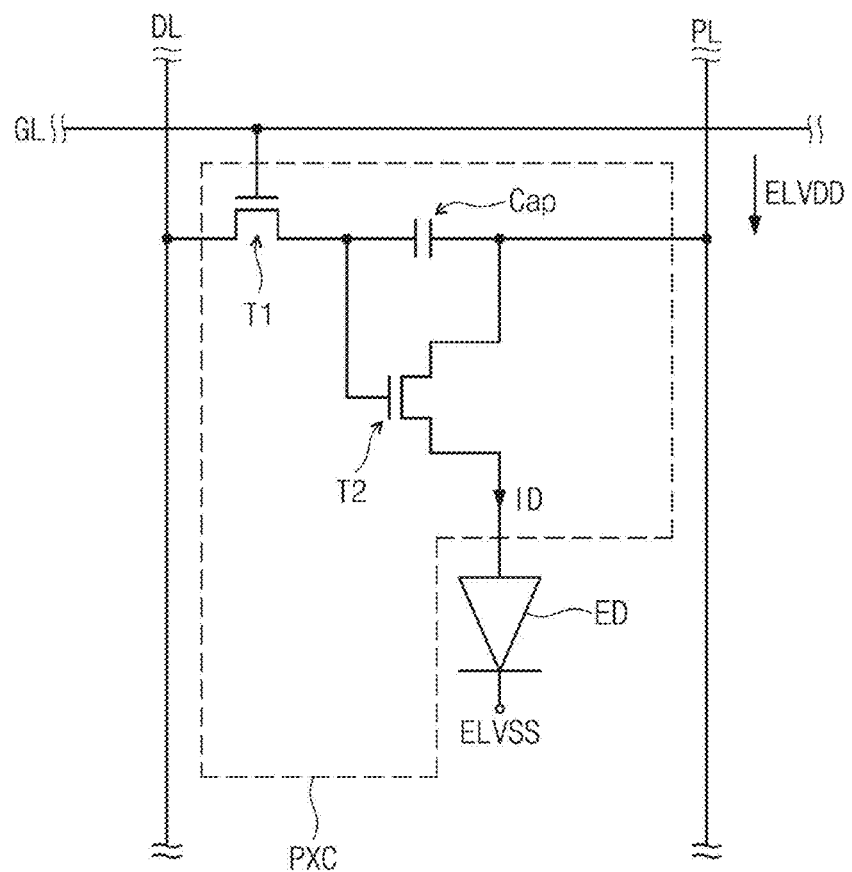
FIG. 5A is an equivalent circuit diagram of a pixel according to an embodiment of the inventive concept.
Figure 5B:
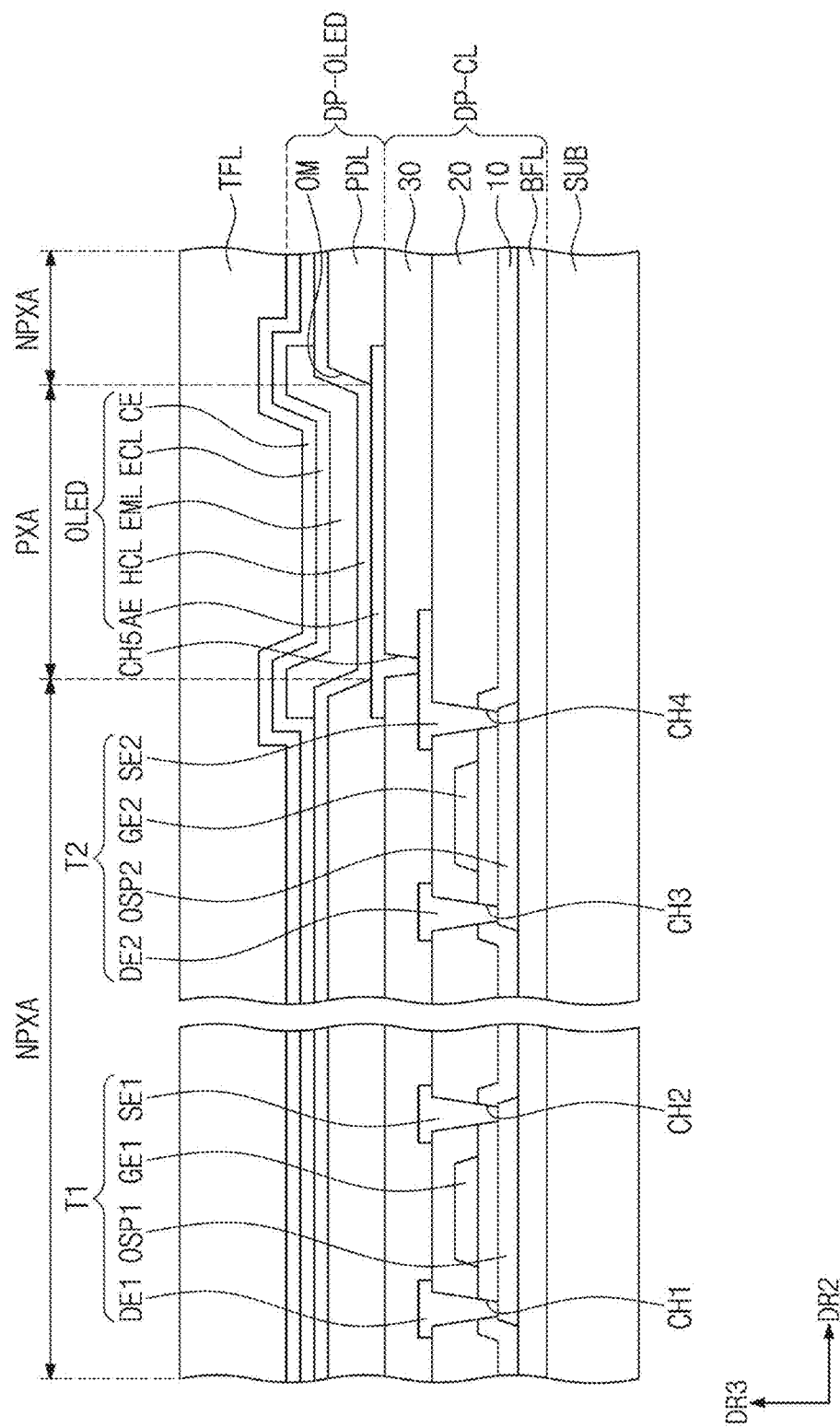
FIG. 5B is a partial sectional view showing a part of the display device according to an embodiment of the inventive concept.

FIG. 4 is a plan view of the display device according to an embodiment of the inventive concept. FIG. 5A is an equivalent circuit diagram of a pixel according to an embodiment of the inventive concept. FIG. 5B is a partial sectional view showing a portion of the display device according to an embodiment of the inventive concept.

In relation to FIG. 4, the display device DD includes a display panel DP, a circuit board FB electrically connected to the display panel DP, and a driving circuit board PB electrically connected to the circuit board FB.

The display panel DP may include a gate driving circuit GDC, a plurality of signal lines SGL, a plurality of first pads PD1 overlapping a first pad area SA, and a plurality of pixels PX.

The plurality of pixels PX are disposed in the display area DP-DA. Each of the plurality of pixels PX includes an organic light emitting diode and a pixel driving circuit PXC (see FIG. 5A) connected thereto. The gate driving circuit GDC, the signal lines SGL, the first pads PD1, and/or the pixel driving circuit PXC may be included in the circuit element layer DP-CL disposed on the base substrate SUB shown in FIG. 3.

In FIG. 5A, any one gate line GL, any one data line DL, a power line PL, and a pixel PX connected thereto are shown. However, the configuration of the pixel PX may not be limited to the one shown in FIG. 5A, but may be modified in accordance with a desired practical application.

The pixel may include an organic light emitting diode ED and a pixel driving circuit PXC.

The organic light emitting diode ED may be a front surface light emitting type diode or a rear surface light emitting type diode. The pixel PX includes, as the pixel driving circuit PXC configured to drive the organic light emitting diode ED, a first transistor T1 (or a switching transistor), a second transistor T2 (or a driving transistor) and a capacitor Cap (or a storage capacitor). A first power supply voltage ELVDD is provided to the second transistor T2, a second power supply voltage ELVSS is provided to the organic light emitting diode ED. The second power supply voltage ELVSS may be lower than the first power supply voltage ELVDD.

The first transistor T1 outputs a data signal to be applied to the data line DL in response to a gate signal applied to the gate line GL. The capacitor Cap charges a voltage corresponding to the data signal received from the first transistor T1. The second transistor T2 is connected to the organic light emitting diode ED. The second transistor T2 controls a driving current flowing through the organic light emitting diode ED in correspondence to an amount of charges stored in the capacitor Cap.

The equivalent circuit described above is just one embodiment and embodiments of the present disclosure are not limited thereto. For example, the pixel PX may further include a plurality of transistors, and a larger number of capacitors.

Referring to FIG. 4 again, the gate driving circuit GDC generates a plurality of gate signals, and sequentially outputs the gate signals to the plurality of gate lines GL. In addition, the gate driving circuit GDC may further output another control signal to the pixel driving circuit PXC of the pixels PX.

The gate driving circuit GDC may include a plurality of thin-film transistors provided through the same process as that of the pixel driving circuit PXC of the pixels PX, for example, a Low Temperature Polycrystalline Silicon (LTPS) process, and/or a Low Temperature Polycrystalline Oxide (LTPO) process.

The signal lines SGL may overlap the display area DP-DA and the non-display area DP-NDA, and be disposed on the base substrate SUB. The signal lines SGL may include the gate lines GL, the data lines DL, the power line PL, and the control signal line CSL. Each of the gate lines GL is connected to a corresponding pixel among the pixels PX, and each of the data lines DL is connected to a corresponding pixel among the pixels PX. The power line PL is connected to the pixels PX. The control signal line CSL may provide control signals to the gate driving circuit GDC.

The circuit board FB may be connected to one end of the display panel DP and one end of the driving circuit board PB. According to an embodiment, the circuit board FB may be provided with a flexible printed circuit board. For example, as shown in FIG. 2, the circuit board FB may be bent along one side of the display panel DP to be disposed on the rear surface of the display panel DP.

Although in FIG. 4, the circuit board FB is shown as separated from the display panel DP and the driving circuit board PB, the circuit board FB may be connected to a portion of the non-display area DP-NDA of the display panel DP and a portion of the driving circuit board PB.

The circuit board FB may include a first board FCB and a plurality of second pads PD2 disposed on the first board FCB. The second pads PD2 may be disposed in a second pad area FA1 defined in the first board FCB. When the circuit board FB and the display panel DP are bonded, the first pad area SA and the second pad area FA1 may overlap each other.

The second pads PD2 may be electrically and respectively bonded to the first pads PD1 disposed in the first pad area SA. As a result, a plurality of driving signals delivered from the second pads PD2 may be delivered to the display panel DP through the first pads PD1.

According to an embodiment of the inventive concept, the first pads PD1 (hereinafter, first pad) of the display panel DP may be respectively bonded to the second pads PD2 (hereinafter, second pad) of the circuit board FB on the basis of an ultrasonic bonding scheme. The ultrasonic bonding scheme may refer to a process in which two metal materials are directly bonded through a pressure and an ultrasonic vibration. As a result, the first pad PD1 may contact the second pad PD2, and the first pad PD1 and the second pad PD2 may be electrically connected with each other.

In a related display panel, the second pad of the circuit board may include at least two laminated metal layers. When the second pad is provided with two or more metal layers, the process cost increases and the ultrasonic bonding may not be easy between the metal layer of the second pad and the metal layer of the first pad, which contact.

According to an embodiment of the inventive concept, the second pad PD2 included in the circuit board FB may be provided with a first metal layer composed of a single material. Here, the second pad PD2 according to an embodiment of the inventive concept may be provided with a metal material for which the ultrasonic boding is easy (or suitable) with the metal layer included in the first pad PD1. Accordingly, the entire process cost may be reduced, and the ultrasonic bonding between the first pad PD1 and the second pad PD2 may become easier. A detailed description thereabout will be provided with reference to FIG. 6.

In some embodiments, the circuit board FB may include the first board FCB and a plurality of third pads PD3 disposed on the first board FCB. In the circuit board FB, a third pad area FA2 overlapping a driving pad area PA of the driving circuit board PB is defined, and the third pads PD3 may be disposed on the first board FCB to overlap the third pad area FA2. When the circuit board FB is bonded with the driving circuit board PB, the third pad area FA2 may overlap the driving pad area PA defined in the driving circuit board PB.

The third pads PD3 may be separated from the second pads PD2 on the plane (e.g., along the second direction DR2) with a driving chip DC interposed therebetween. The driving chip DC may be electrically connected to the second pads PD2 and the third pads PD3. The driving chip DC receives the driving signals output from the driving circuit board PB through the third pads PD3, and outputs the data signals to be provided to the pixels PX on the basis of the received driving signals. The data signals may be delivered to the first pads PD1 through the second pads PD2. The first pads PD1 may respectively deliver the data signals from the driving chip DC to the data lines DL from among the signal lines SGL.

Although the driving chip DC is described herein as being disposed on the circuit board FB, the technical spirit of the inventive concept is not limited thereto. As another example, the driving chip DC may be mounted on the base substrate SUB of the display panel DP.

The driving circuit board PB may generate the overall driving signals and power supplying signals required to drive the input sensing unit ISU, and may provide the generated driving signals and power supplying signals to the display panel DP and the input sensing unit ISU. The driving circuit board PB may include a second board PCB and driving pads PDd (hereinafter, driving pad) disposed on the second board PCB. The driving pad PDd may be disposed in the driving pad area PA defined in the second board PCB.

According to an embodiment of the inventive concept, the third pad PD3 included in the circuit board FB may be provided with a second metal layer composed of a single material. The second metal layer of the third pad PD3 may comprise (be composed of) the same material as that of the first metal layer of the second pad PD2. For example, the third pad PD3 may be provided with (may be composed of) a metal material for which the ultrasonic bonding is easy (or suitable) with the metal layer included in the driving pad PDd. Accordingly, the overall process cost may be reduced, and the ultrasonic bonding may be easier between the third pad PD3 and the driving pad PDd.

Although the third pad PD3 and the driving pad PDd are described herein as being bonded on the basis of the ultrasonic boding scheme, the technical spirit of the inventive concept is not limited thereto. For example, according to another embodiment, the third pad PD3 and the driving pad PDd may be electrically connected through an adhesive member. In this case, the third pad PD3 and the driving pad PDd may be electrically connected through conductive particles. A more detailed description thereof will be provided in relation to FIGS. 9A and 9B.

In relation to FIG. 5B, a partial cross-section of the display panel, which corresponds to the equivalent circuit of the pixel shown in FIG. 5A, is illustrated. A circuit element layer DP-CL, a display element layer DP-OLED, and an insulation layer TFL are sequentially disposed on the base substrate SUB.

The circuit board FB shown in FIG. 4 may be disposed on a portion of the base substrate SUB, and this portion does not overlap the display element layer DP-OLED. The second pads PD2 included in the circuit board FB may be connected to the first pads PD1 included in the circuit element layer DP-CL.

In some embodiments, the circuit element layer DP-CL includes at least one insulation layer and a circuit element. The circuit element includes signal lines and a driving circuit of a pixel, and/or the like. The circuit element layer DP-CL may be provided through a process of providing an insulation layer, a semiconductor layer and/or a conduction layer, and may be manufactured by coating, deposition and/or the like, a photolithography process for the insulation layer, and/or a patterning process for the semiconductor layer and/or the conduction layer.

The circuit element layer DP-CL may include a buffer layer BFL that is an inorganic layer, a first intermediate inorganic layer 10 and a second intermediate inorganic layer 20, and an intermediate organic layer 30 that is an organic layer. The buffer layer BFL may include a plurality of laminated inorganic layers. FIG. 5B exemplarily illustrates disposition relationships among a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2. First to fourth through holes CH1, CH2, CH3, and CH4 are also exemplarily illustrated.

The display element layer DP-OLED may include an organic light emitting diode OLED. The display element layer DP-OLED includes a pixel define layer PDL. For example, the pixel define layer PDL may be an organic layer.

A first electrode AE is disposed on the intermediate organic layer 30. The first electrode AE is connected to the second output electrode SE2 through a fifth through hole CH5 penetrating through the intermediate organic layer 30. An opening part OM is defined in the pixel define layer PDL. The opening part OM of the pixel define layer PDL exposes at least a portion of the first electrode AE. The opening part OM of the pixel define layer PDL is referred to as a light emitting opening part in order to be distinguished from other opening parts.

In some embodiments, on the top surface of the pixel define layer PDL, a spacer may be disposed overlapping a portion of the pixel define layer PDL. The spacer may have a shape of one body with the pixel define layer PDL (e.g., the spacer may be integrally formed with the pixel define layer PDL), or the spacer may be an insulation structure provided by an additional process.

The pixel may include a light emitting area PXA and a non-light emitting area NPXA adjacent to the light emitting area PXA. The non-light emitting area NPXA may surround the light emitting area PXA. In the embodiment, the light emitting area PXA is defined to correspond to a portion of the first electrode AE exposed by the light emitting opening part OM.

A hole control layer HCL may be commonly disposed in the light emitting area PXA and the non-light emitting area NPXA. The hole control layer HCL may include a hole transport layer, and further include a hole injection layer. A light emitting layer EML is disposed on the hole control layer HCL. The light emitting layer EML may be disposed in an area corresponding to the light emitting opening part OM. In other words, the light emitting layer EML may be separately provided in each of the plurality of pixels. The light emitting layer EML may include an organic material and/or an inorganic material. The light emitting layer EML may generate prescribed (or set) colored light.

An electron control layer ECL is disposed on the light emitting layer EML. The electron control layer ECL may include an electron transport layer, and further include an electron injection layer. The hole control layer HCL and the electron control layer ECL may be commonly provided in a plurality of pixels using an open mask. The second electrode CE is disposed on the electron control layer ECL. The second electrode CE may have a one body shape (e.g., may be formed integrally) and may be commonly disposed on the electron control layer ECL included in each of the plurality of pixels.

The insulation layer TFL is disposed on the second electrode CE. The insulation layer TFL may be a single encapsulation layer or a plurality of thin films.

Figure 6:
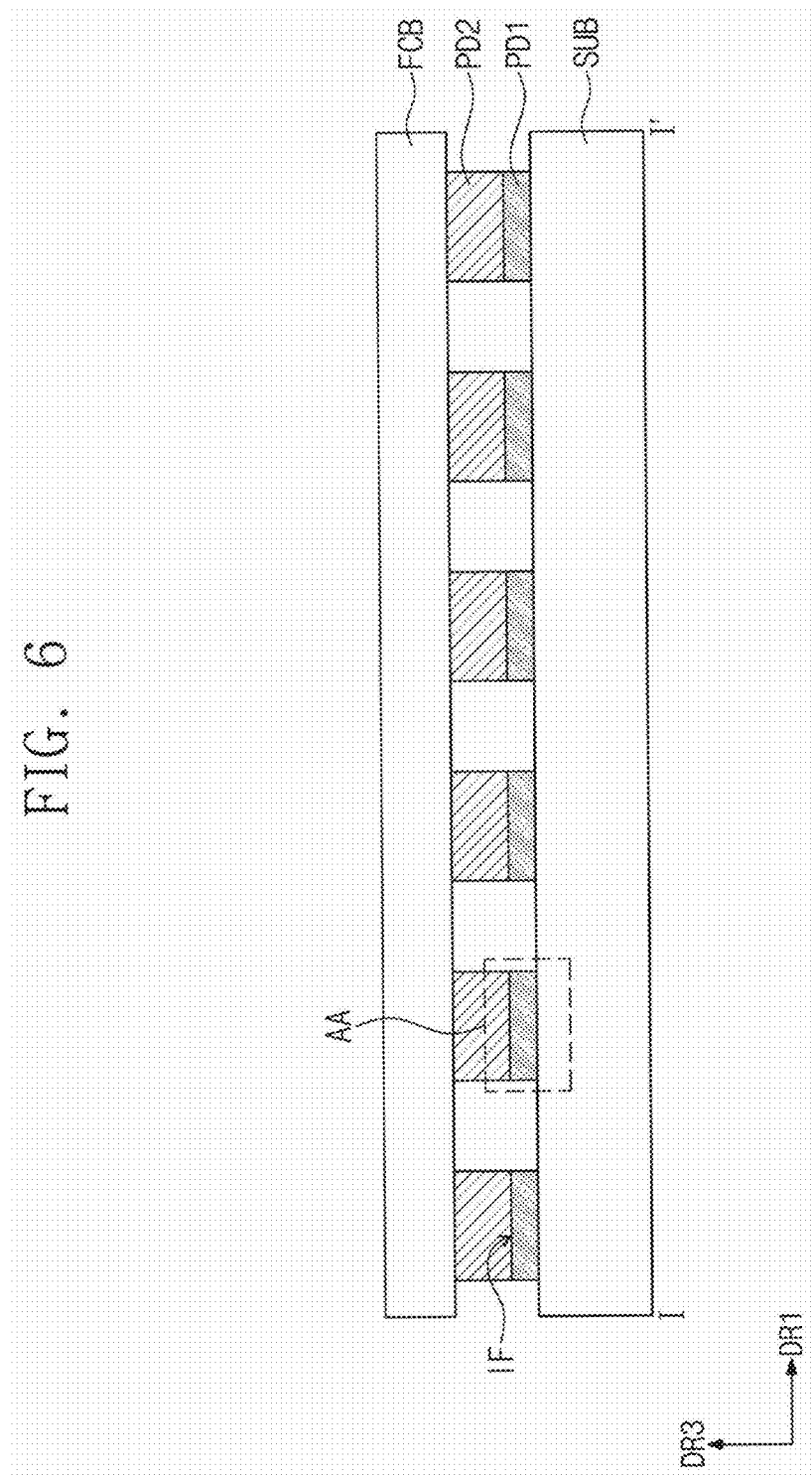
FIG. 6 is a sectional view cut along line I-I' shown in FIG. 4 according to an embodiment of the inventive concept.
Figure 7:
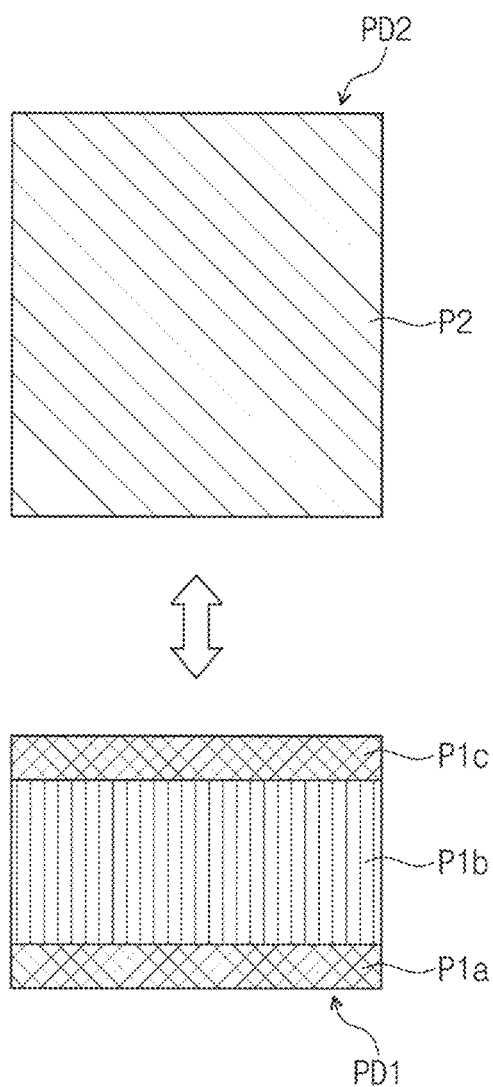
FIG. 7 shows a bonding between a first pad and a second pad according to an embodiment of the inventive concept.
Figure 8:
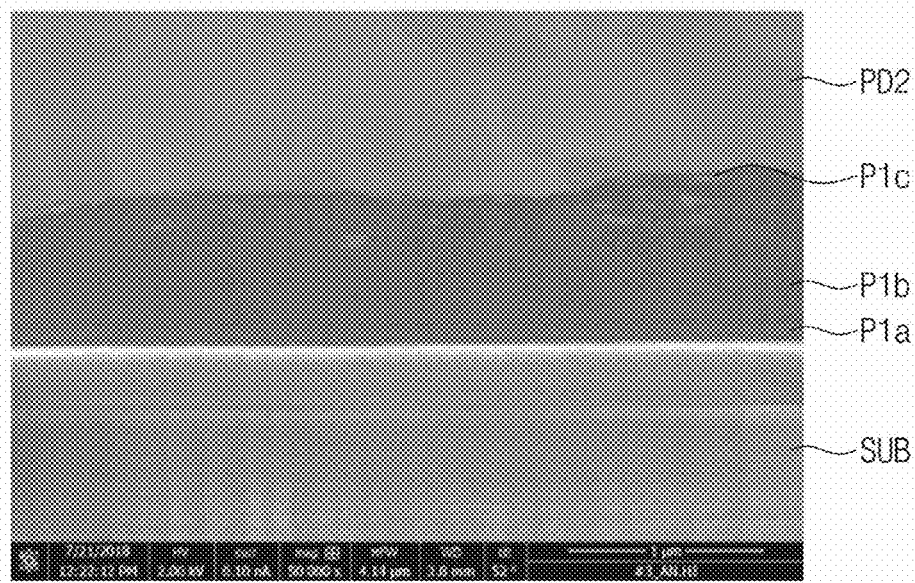
FIG. 8 is an enlarged view of an area AA shown in FIG. 6.

FIG. 6 is a sectional view cut along I-I' shown in FIG. 4 according to an embodiment of the inventive concept. FIG. 7 shows a bonding between a first pad and a second pad according to an embodiment of the inventive concept. FIG. 8 is an enlarged view of an AA area shown in FIG. 6.

In relation to FIG. 6, the base substrate SUB may face the first board FCB in the third direction DR3. The first pad PD1 and the second pad PD2 may face each other and contact each other in the third direction DR3.

As described above in relation to FIG. 4, the first pad PD1 and the second pad PD2 according to the inventive concept may be directly bonded through the ultrasonic bonding scheme. For example, the second pad PD2 may be provided with the first metal layer P2 (see FIG. 7) composed of a single material, and may be provided with a metal material that is easy (or suitable) to be ultrasonically bonded with the first pad PD1.

In more detail, in relation to FIG. 7, the first pad PD1 includes a first sub metal layer P1a disposed on the base substrate SUB, a second sub metal layer P1b disposed on the first sub metal layer P1a, and a third sub metal layer P1c disposed on the second sub metal layer P1b. The second pad PD2 composed of a single material may be disposed on the third sub metal layer P1c, and the third sub metal layer P1c may contact the second pad PD2.

According to an embodiment of the inventive concept, the first sub metal layer P1a and the third sub metal layer P1c may be provided with (e.g., may be composed of) an identical (same) material, and may each have a smaller thickness than the second sub metal layer P1b. For example, each of the first sub metal layer P1a and the third sub metal layer P1c according to an embodiment of the inventive concept may be provided with titanium (Ti), and the second sub metal layer P1b may be provided with aluminum (Al). In addition, the second pad PD2 may be provided with copper (Cu).

The first sub metal layer P1a provided with titanium may be easy (or suitable) to be ultrasonically bonded with the base substrate SUB provided with a glass substrate and the second sub metal layer P1b provided with aluminum. In addition, the third sub metal layer P1c provided with titanium may be easy (or suitable) to be ultrasonically bonded with the second sub metal layer P1b provided with aluminum and the second pad PD2.

The ultrasonic bonding between titanium and copper may have a higher bonding efficiency than the ultrasonic bonding between aluminum and copper. Here, the higher bonding efficiency may mean that the direct contact area between two components is larger. As a result, electrical characteristics between the first pad PD1 and the second pad PD2 may be improved.

In relation to FIG. 8, an ultrasonic bonding process between the first pad PD1 and the second pad PD2 is shown. As the ultrasonic process between the second pad PD2 provided with (composed of) copper and the third sub metal layer P1c provided with (composed of) titanium proceeds, the second pad PD2 becomes contacted (e.g., comes in contact with) the third sub metal layer P1c. According to an embodiment of the inventive concept, since the third sub metal layer P1c is provided thinly, at least a portion of the third sub metal layer P1c may be removed at the time of the ultrasonic bonding between the third sub metal layer P1c and the second pad PD2. As a result, at least a portion of the second pad PD2 may contact the second sub metal layer P1b.

Figure 9A:
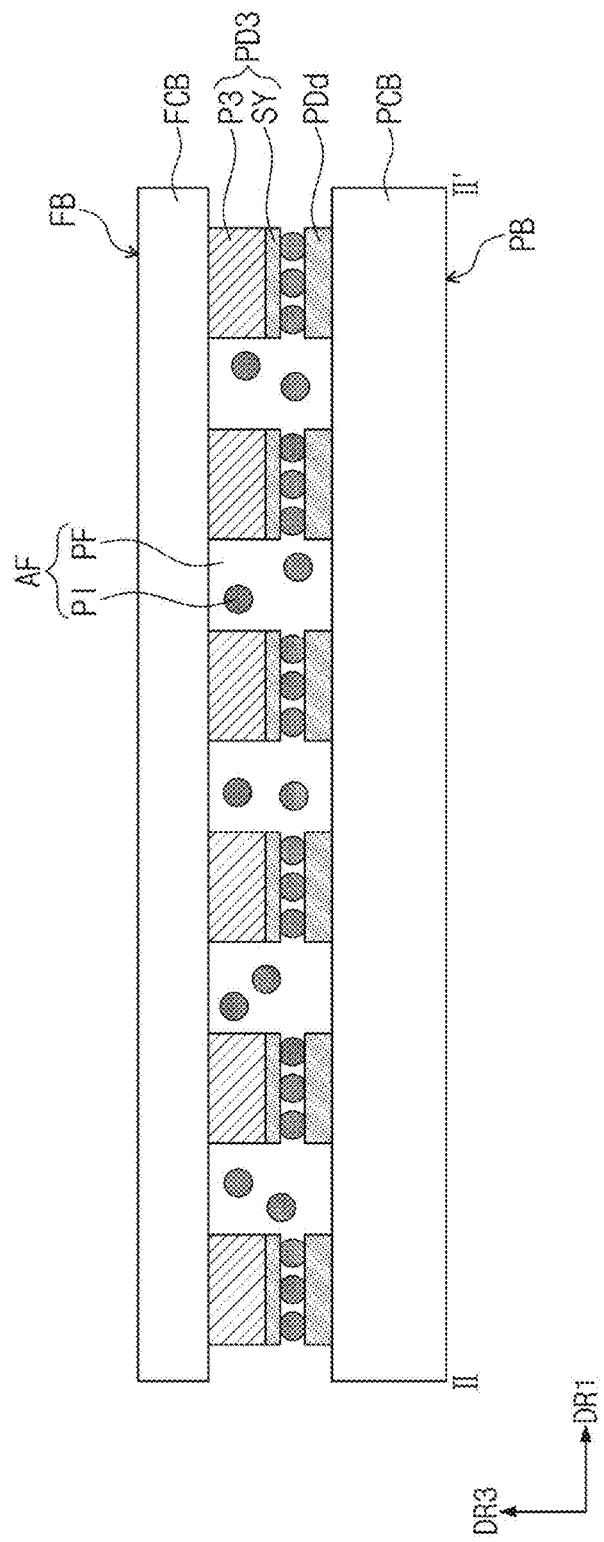
FIG. 9A is a sectional view cut along line II-II' shown in FIG. 4 according to an embodiment of the inventive concept.
Figure 9B:
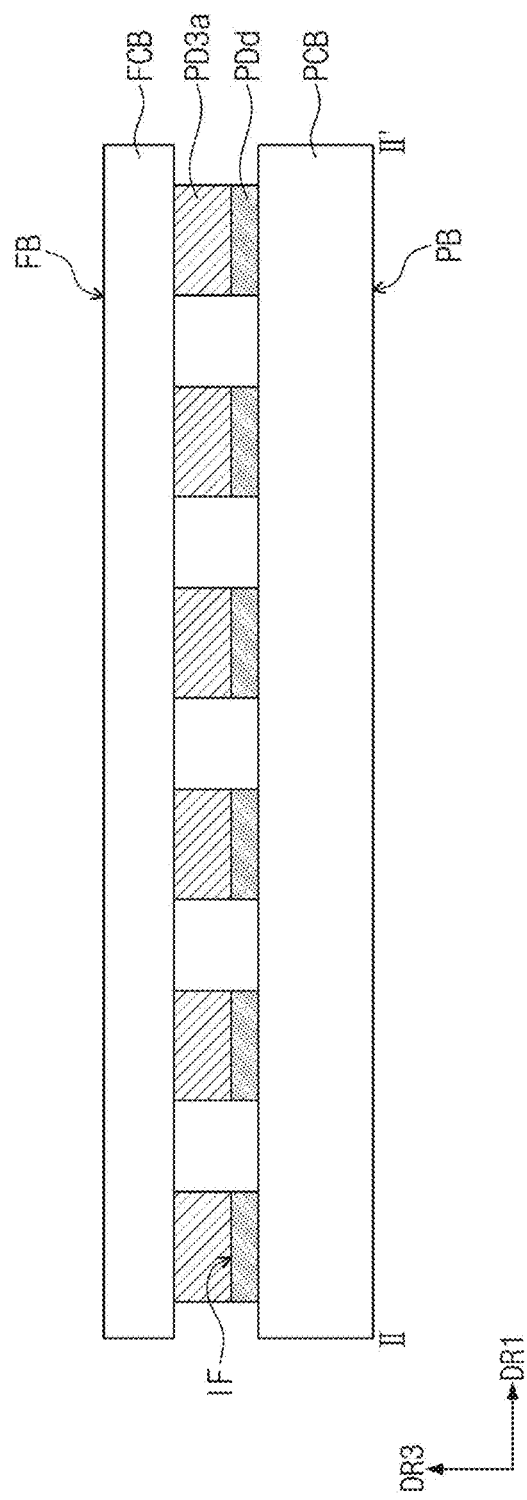
FIG. 9B is a sectional view cut along line II-II' shown in FIG. 4 according to another embodiment of the inventive concept.

FIG. 9A is a sectional view cut along II-II' shown in FIG. 4 according to an embodiment of the inventive concept. FIG. 9B is a sectional view cut along II-II' shown in FIG. 4 according to another embodiment of the inventive concept.

As described above in relation to FIG. 4, the third pad area FA2 overlapping the driving pad area PA of the driving circuit board PB is defined in the circuit board FB. According to an embodiment of the inventive concept, the circuit board FB and the driving circuit board PB may be electrically bonded through the adhesive member AF.

In relation to FIG. 9A, the circuit board FB may include the first board FCB and the plurality of third pads PD3 disposed on the first board FCB. The third pads PD3 may be disposed on the first board FCB together with the second pads PD2. The driving circuit board PB may include the second board PCB and the driving pads PDd (hereinafter, driving pad) disposed on the second board PCB and electrically connected to the third pads PD3, respectively.

Each of the third pads PD3 (hereinafter, third pad) may include a second metal layer P3 and an auxiliary metal layer SY. The second metal layer P3 according to an embodiment of the inventive concept may be provided with copper, and the auxiliary metal layer SY may be provided with antimony (Sn).

The auxiliary metal layer SY may prevent or reduce the second metal layer P3 from being oxidized externally. When the auxiliary metal layer SY is omitted, an oxidization layer may be provided on the surface of the second metal layer P3. For example, as the second metal layer P3 is provided with copper, a copper oxide layer CuO may be provided on the surface of the second metal layer P3. However, because the conductivity of the copper oxide CuO is low, electrical connection characteristics between the third pad PD3 and the driving pad PDd connected electrically through the adhesive member AF may be lowered.

The auxiliary metal layer SY according to an embodiment of the inventive concept is provided on the second metal layer P3 to prevent or reduce the second metal layer P3 from being oxidized externally. In embodiments of the present disclosure, as the auxiliary metal layer SY is provided with antimony (Sn) having high conductivity, the electrical connection characteristics between the second metal layer P3 and the driving pad PDd may be improved.

As shown in FIG. 9A, the circuit board FB may be electrically connected with the driving circuit board PB through the adhesive member AF. The adhesive member AF may be provided with an anisotropic conductive film. For example, the adhesive member AF may include conductive particles PI provided in an adhesive film PF having an adhesive property. The conductive particles PI electrically conduct (e.g., electrically connect) the third pad PD3 and the driving pad PDd.

Accordingly, the driving signal delivered to the driving pad PDd through a circuit element mounted on the second board PCB may be provided to the third pad PD3 through the adhesive member AF. The driving signal delivered to the third pad PD3 may be delivered to the first pad PD1.

In relation to FIG. 9B, the circuit board FB and the driving circuit board PB according to another embodiment of the inventive concept may be electrically bonded through the ultrasonic bonding scheme.

As shown in FIG. 9B, the third pad PD3a is disposed on the first board FCB. The third pad PD3a of the inventive concept may be provided with a second metal layer composed of a single material. For example, the third pad PD3a may be provided with (composed of) copper.

As described above, since the third pad PD3a is provided with copper, the third pad PD3a is oxidized externally to provide the copper oxide layer CuO on the third pads PD3a.

However, the copper oxide layer CuO may be removed through an ultrasonic bonding process between the third pad PD3a and the driving pad PDd. Through the ultrasonic bonding, the third pad PD3a and the driving pad PDd may contact.

Accordingly, the driving signal delivered to the driving pad PDd through the circuit element mounted on the second board PCB may be provided to the third pad PD3a composed of a single material through an interface IF between the driving pad PDd and the third pad PD3a.

Figure 10:
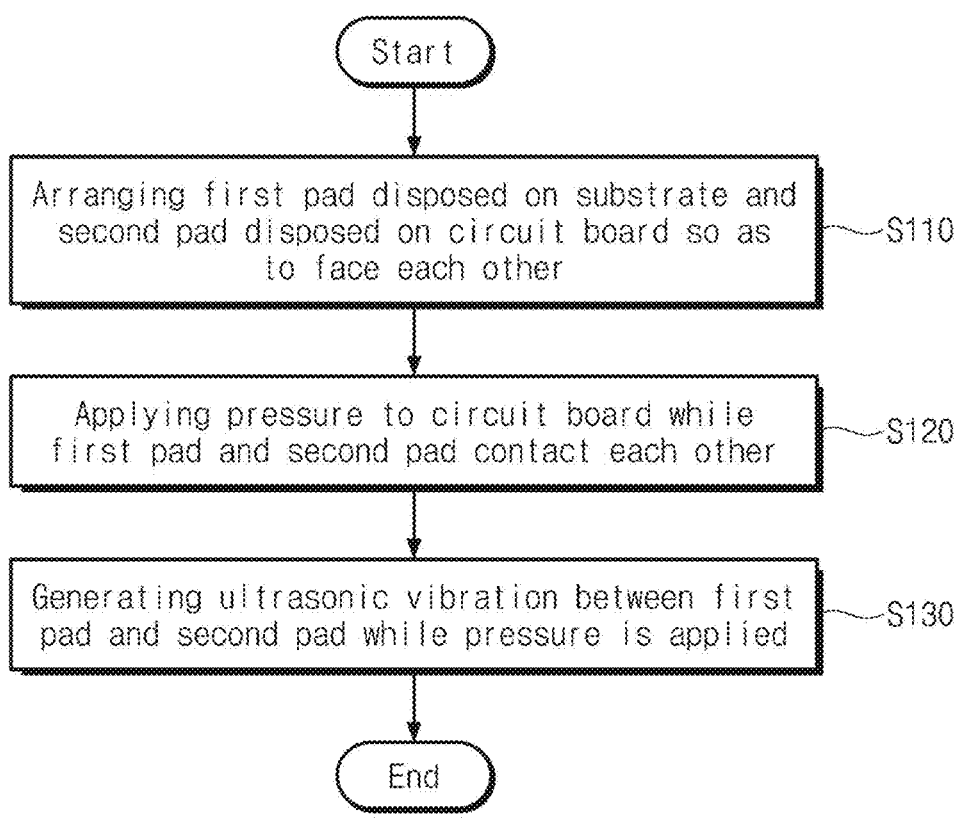
FIG. 10 is a flowchart showing a bonding process between a first pad and a second pad according to an embodiment of the inventive concept.
Figure 11A:
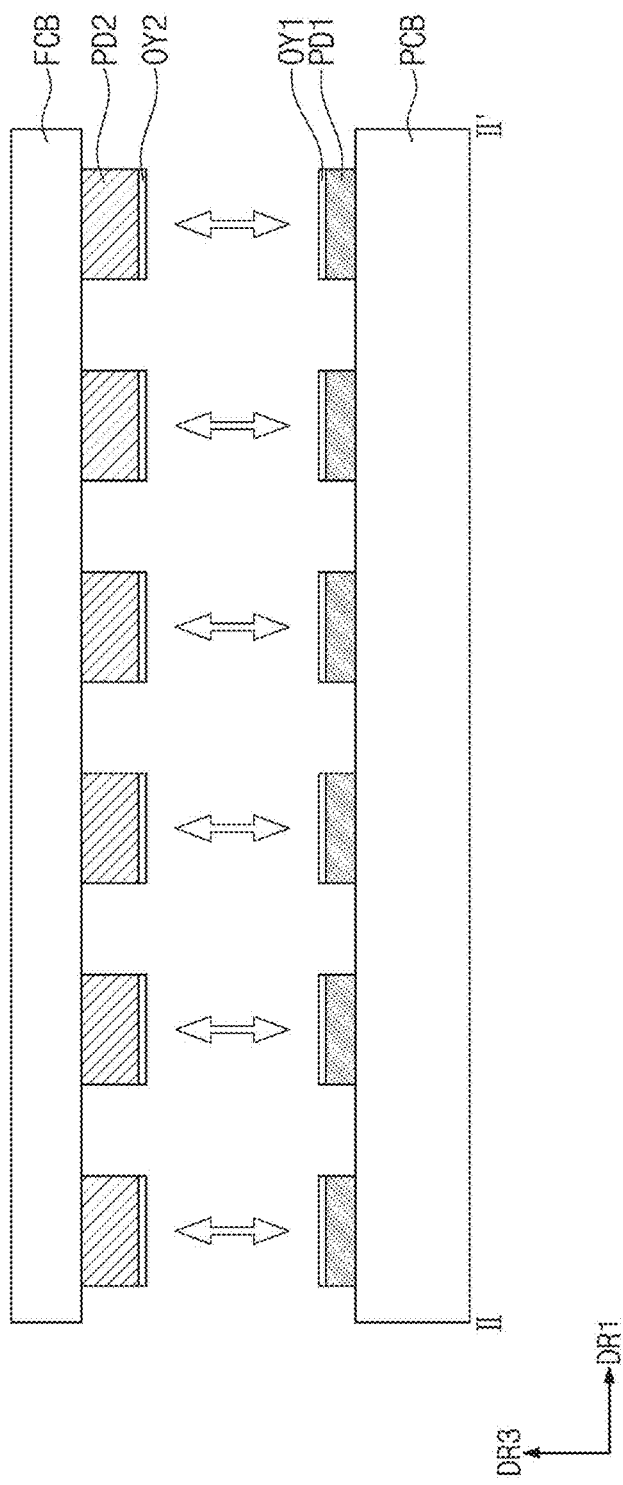

FIG. 10 is a flowchart showing a bonding process between the first pad and the second pad according to an embodiment of the inventive concept. FIGS. 11A to 11C are drawings showing acts of an ultrasonic bonding between the first pad and the second pad.

In relation to FIG. 10, an ultrasonic bonding scheme between the display panel DP and the circuit board FB will be described.

In relation to FIGS. 10 and 11A, in a first operation S110, the first pad PD1 disposed on the base substrate SUB (hereinafter, display substrate or substrate) may be arranged to face the second pad PD2 disposed on the first board FCB in the third direction DR3. In this case, the first pad PD1 and the second pad PD2 may be separated in the third direction DR3.

In some embodiments, a first oxidation layer OY1 is provided on the first pad PD1, and a second oxidation layer OY2 is provided on the second pad PD2. The first oxidation layer OY1 may be a titanium oxidation layer that resulted from reacting with titanium, and the second oxidation layer OY2 may be a copper oxidation layer that resulted from reacting with copper.

The second pad PD2 according to an embodiment of the inventive concept may be provided with a metal layer composed of a single material, and the first pad PD1 may be provided with a plurality of sub metal layers in which titanium and aluminum are alternately laminated.

In relation to FIGS. 10 and 11B, the first oxidation layer OY1 disposed on the first pad PD1 and the second oxidation layer OY2 disposed on the second pad PD2 may contact each other. Then, a pressure PS may be applied to the first board FCB of the circuit board FB toward the display substrate SUB. While the pressure is applied, a vibration according to an ultrasonic frequency may be applied to an interface between the first pad PD1 and the second pad PD2. As a result, the surface of the first pad PD1 and the surface of the second pad PD2 may contact each other.

In relation to FIGS. 10 and 11C, as the ultrasonic vibration is applied between the first pad PD1 and the second pad PD2, the first oxidation layer OY1 and the second oxidation layer OY2 may be destructed. As a result, the first pad PD1 and the second pad PD2 may contact (e.g., may be directly connected) to improve electrical characteristics.

In addition, according to an embodiment of the inventive concept, a resin RS may be disposed between the first board FCB and the display substrate SUB. For example, the resin RS may block (or reduce) external air from permeating the first pad PD1 and the second pad PD2. As a result, oxidation of the first pad PD1 and the second pad PD2 may be prevented or reduced.

According to embodiments of the inventive concept, electrical connection characteristics between the circuit board and the display panel may be improved.

Embodiments of the present disclosure have been described above with reference to the drawings and example embodiments. However, the present invention is not limited to the disclosed embodiments. Herein, specific terms have been used, but are just used for the purpose of describing the inventive concept and are not used for defining the meaning or limiting the scope of the inventive concept, which is disclosed in the appended claims and equivalents thereof. Thus it would be appreciated by those skilled in the art that various modifications and other equivalent embodiments can be made. Therefore, the true technical scope of the inventive concept shall be defined by the technical spirit of the appended claims and equivalents thereof.

What is claimed is:

1. A display device comprising:
 a display module comprising a base substrate, the base substrate having a display area and a non-display area adjacent to the display area, and a first pad on the base substrate and overlapping the non-display area; and
 a circuit board comprising a first board and a second pad on the first board, the second pad electrically contacting the first pad, wherein the second pad is a single layer consisting of a single material comprising copper, wherein the second pad is directly on the first pad, and wherein the circuit board further comprises a third pad separated from the second pad on a plane of the circuit board and electrically connected to the second pad;

a driving circuit board comprising a second board and a driving pad on the second board, wherein the driving circuit board is electrically connected to the third pad; and an anisotropic conductive film electrically connecting the third pad and the driving pad, the anisotropic conductive film comprises:

an adhesive film between the first board and the second board; and conductive particles in the adhesive film and configured to electrically connect the third pad and the driving pad, the third pad comprises:

a second metal layer on the first board; and an auxiliary metal layer on the second metal layer and configured to electrically contact the conductive particles, wherein the second metal layer is composed of the same material as that of the second pad.

2. The display device of claim 1, wherein the first pad comprises:

a first sub metal layer on the base substrate;

a second sub metal layer on the first sub metal layer; and a third sub metal layer directly on the second sub metal layer.

3. The display device of claim 2, wherein at least a portion of the second sub metal layer is directly on the second pad.

4. The display device of claim 2, wherein a thickness of the second sub metal layer is greater than that of each of the first sub metal layer and the third sub metal layer.

5. The display device of claim 2, wherein the first sub metal layer and the third sub metal layer comprise the same material.

6. The display device of claim 2, wherein the first sub metal layer and the third sub metal layer comprise titanium, and the second sub metal layer comprises aluminum.

7. The display device of claim 1, further comprising:

a resin between the base substrate and the first board, the resin surrounding the first pad and the second pad.

8. The display device of claim 1, wherein the auxiliary metal layer comprises antimony.

9. The display device of claim 1, wherein the third pad comprises a second metal layer composed of a single material, the third pad contacting the driving pad.

10. The display device of claim 1, wherein the circuit board is a flexible board.

11. The display device of claim 1, wherein each of the first pad and the second pad is provided in plurality.

* * * * *